(12) United States Patent
Yamaoka

(10) Patent No.: US 10,734,861 B2
(45) Date of Patent: Aug. 4, 2020

(54) MOTOR

(71) Applicants: DENSO CORPORATION, Aichi (JP); NIDEC SANKYO CORPORATION, Nagano (JP)

(72) Inventor: Mamoru Yamaoka, Nagano (JP)

(73) Assignees: DENSO CORPORATION, Aichi (JP); NIDEC SANKYO CORPORATION, Nagano (JP)

( * ) Notice: Subject to any disclaimer, the term of this patent is extended or adjusted under 35 U.S.C. 154(b) by 215 days.

(21) Appl. No.: 15/766,705

(22) PCT Filed: Oct. 31, 2016

(86) PCT No.: PCT/JP2016/082248
§ 371 (c)(1),
(2) Date: Apr. 6, 2018

(87) PCT Pub. No.: WO2017/082096
PCT Pub. Date: May 18, 2017

(65) Prior Publication Data
US 2018/0316241 A1 Nov. 1, 2018

(30) Foreign Application Priority Data

Nov. 9, 2015 (JP) ................................ 2015-219016

(51) Int. Cl.
*H02K 5/22* (2006.01)
*H01R 13/447* (2006.01)
(Continued)

(52) U.S. Cl.
CPC ........... *H02K 5/225* (2013.01); *H01R 13/447* (2013.01); *H01R 13/501* (2013.01); *H02K 5/161* (2013.01);
(Continued)

(58) Field of Classification Search
CPC .......... H02K 5/225; H02K 5/22; H02K 5/161; H02K 5/08; H01R 13/501; H01R 13/447; H01R 2201/10; H05K 5/0052; H05K 5/006; H05K 5/0073

USPC ..................................................... 310/71, 89
See application file for complete search history.

(56) References Cited

U.S. PATENT DOCUMENTS

2012/0104878 A1* 5/2012 Heilman .................. H02K 5/10
310/43
2014/0329417 A1* 11/2014 Matsuzaki ............. H02K 5/225
439/709

FOREIGN PATENT DOCUMENTS

CN 103813668 A 5/2014
DE 196 07 190 A1 8/1997
(Continued)

OTHER PUBLICATIONS

WIPO, International Search Report for PCT/JP2016/082248, dated Jan. 24, 2017.
(Continued)

*Primary Examiner* — Thomas Truong

(57) ABSTRACT

The purpose of the invention is to provide a motor in which it is possible to efficiently construct a structure wherein a terminal part of a motor body is covered by a terminal cover. This terminal cover (7) is a resin molded article integrally including a first member (8) fixed to a motor body (40), a second member (9) that covers the first member (8), and a hinge part (70). Thus, the first member (8) and the second member (9) can be engaged with one another by first fixing the first member (8) to the motor body (40), and then rotating the second member (9) at the hinge part (70) and covering the first member (8) with the second member (9). Thus, the number of components can be reduced compared to cases where the first member (8) and the second member (9) are constructed as separate members, and the task of attaching the second member (9) to the first member (8) can be performed efficiently.

13 Claims, 7 Drawing Sheets

(51) Int. Cl.
*H02K 5/16* (2006.01)
*H01R 13/50* (2006.01)
*H05K 5/00* (2006.01)
*H02K 5/08* (2006.01)

(52) U.S. Cl.
CPC .............. *H02K 5/22* (2013.01); *H05K 5/006* (2013.01); *H05K 5/0052* (2013.01); *H05K 5/0073* (2013.01); *H01R 2201/10* (2013.01); *H02K 5/08* (2013.01)

(56) References Cited

FOREIGN PATENT DOCUMENTS

| DE | 10 2013 222851 A1 | 5/2014 |
|----|-------------------|--------|
| JP | S52-98105 U | 7/1977 |
| JP | S57-20139 A | 2/1982 |
| JP | H05-78168 U | 10/1993 |
| JP | H05-78170 U | 10/1993 |
| JP | H07-42015 U | 7/1995 |
| JP | H07-42554 U | 8/1995 |
| JP | 2014-96960 A | 5/2014 |
| JP | 2014-180184 A | 9/2014 |
| JP | 2014-209835 A | 11/2014 |

OTHER PUBLICATIONS

WIPO, Written Opinion of the International Searching Authority for PCT/JP2016/082248, dated Jan. 24, 2017.
Japan Patent Office, Notice of Reasons for Refusal for Japanese Patent Application No. 2015-219016, dated Aug. 27, 2019.
European Patent Office, Extended European Search Report for European Patent Application No. 16864059.7, dated Apr. 26, 2019.

\* cited by examiner

MOTOR

FIELD OF THE INVENTION

The present invention relates to a motor in which a terminal cover is attached to a motor main body.

BACKGROUND ART

A terminal cover for a motor is sometimes attached to a side face of a motor main body so that a terminal part of the motor main body is covered with the terminal cover in order to protect terminals in the terminal part, an electric connected portion with the terminals and a wiring board or the like. The terminal cover is structured of a bracket (first member) fixed through engagement with the side face of the motor main body and a cap (second member) covered on the bracket (see Patent Literature 1).

CITATION LIST

Patent Literature

[PTL 1] Japanese Patent Laid-Open No. 2014-209835

SUMMARY OF THE INVENTION

Technical Problem

However, when the terminal cover is structured of a plurality of members like the motor described in Patent Literature 1, the number of components is increased and much time and labor are required for an attaching work of the cap to set a state that the bracket is covered with the cap.

In view of the problem described above, an objective of the present invention is to provide a motor which is capable of efficiently structuring a structure that a terminal part of a motor main body is covered with a terminal cover.

Solution to Problem

To achieve the above mentioned objective, the present invention provides a motor including a motor main body in which a rotation shaft is protruded toward an output side, and a terminal cover which covers a terminal part provided on one side in a first direction of the motor main body from the one side in the first direction. The terminal cover is a resin molded product which is integrally provided with a first member fixed to the motor main body on the one side in the first direction, a second member which covers the first member from the one side in the first direction, and a hinge part which turnably connects the second member with the first member around an axial line extended in a second direction intersecting the first direction. The second member is provided with an engaging part structured to fix the second member to the first member.

In the present invention, the terminal cover which covers the terminal part of the motor main body is a resin molded product which is integrally provided with a first member which is fixed to the motor main body, a second member which covers the first member, and a hinge part which connects the first member with the second member. Therefore, after the first member is fixed to the motor main body, when the second member is turned through the hinge part and the first member is covered by the second member, the first member and the second member can be engaged with each other. Accordingly, in comparison with a case that the first member and the second member are separately structured, the number of components can be reduced and an attaching work of the second member to the first member can be performed efficiently.

In the present invention, it is preferable that the engaging part includes, at each of end parts on both sides in the second direction of the second member, a first engaging part which is provided at a position separated from the hinge part on one side in a third direction intersecting the first direction and the second direction so as to be abutted with a first engaging protruded part of the first member from the other side in the first direction and from one side in the third direction, and a second engaging part which is provided at a position separated from the first engaging part on the one side in the third direction so as to be abutted with a second engaging protruded part of the first member from the other side in the first direction and from the other side in the third direction. According to this structure, the second member can be prevented from being disengaged in a direction separated from the first member by the first engaging part and the second engaging part. Further, the first engaging part and the second engaging part are engaged with the first member in reverse directions regarding the third direction and thus the first engaging part and the second engaging part are hard to be disengaged from the first engaging protruded part and the second engaging protruded part. Further, when the second member is to be turned through the hinge part, the first engaging part is passed at a separated position from the hinge part with respect to the first engaging protruded part and then engaged, and the second engaging part is passed on a side of the hinge part with respect to the second engaging protruded part and then engaged. Therefore, the first engaging part and the first engaging protruded part are surely engaged with each other, and the second engaging part is surely engaged with the second engaging protruded part.

In the present invention, it may be structured that the first member holds a wiring board which is electrically connected with terminals of the terminal part, and the second member covers the wiring board from the one side in the first direction.

In the present invention, it is preferable that the first member is provided with a circuit board support face which supports the wiring board from the other side in the first direction, and a circuit board holding pawl which is protruded from the circuit board support face to the one side in the first direction to be abutted with a face on the one side in the first direction of the wiring board. According to this structure, the wiring board can be held in a thickness direction of the wiring board by the circuit board support face and the circuit board holding pawl.

In the present invention, it is preferable that an end part of the wiring board is formed with a recessed part to which the circuit board holding pawl is fitted at an overlapped position with the circuit board holding pawl. According to this structure, the wiring board can be held by the circuit board holding pawl in an extending direction of the end part of the wiring board where the recessed part is formed.

In the present invention, it is preferable that the first member is provided with a positioning protruded part which is protruded from the circuit board support face to the one side in the first direction to be abutted with an end part of the wiring board. According to this structure, the wiring board can be disposed at a predetermined position of the first member.

In the present invention, it is preferable that the second member is provided with a circuit board holding part which is protruded to the other side in the first direction to be abutted with the wiring board from the one side in the first direction. According to this structure, the circuit board can be suppressed from being floated from the first member.

DESCRIPTION OF EMBODIMENTS

Figure 1A:
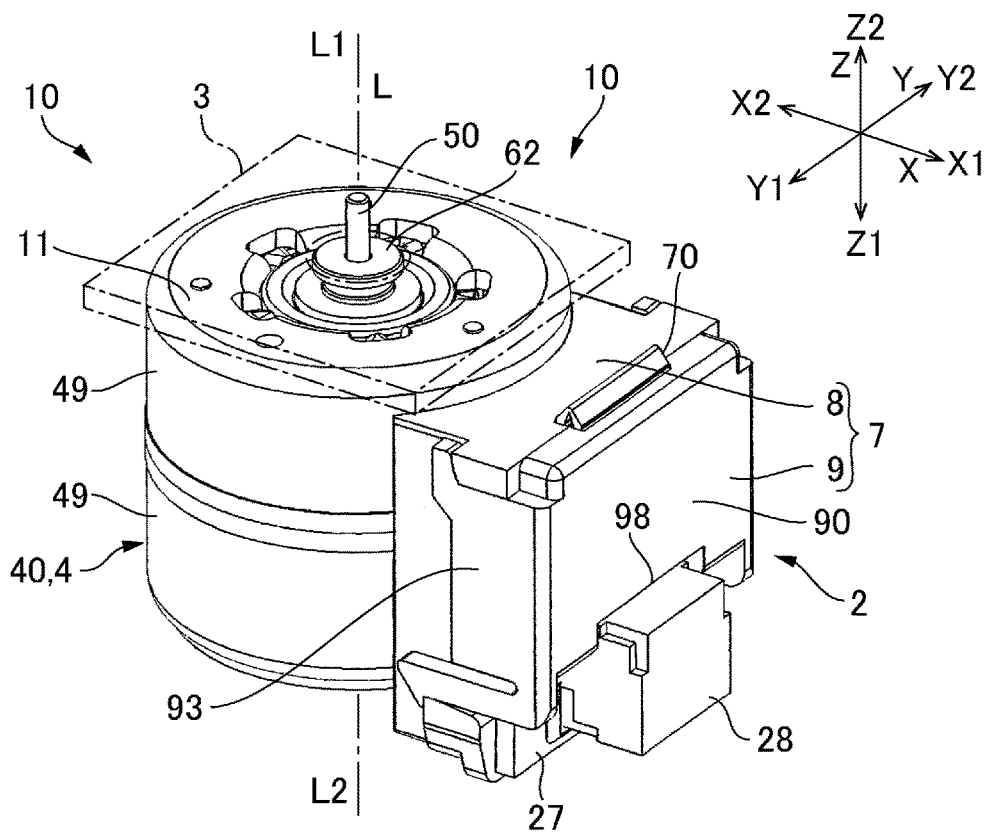
FIGS. 1(a) and 1(b) are explanatory views showing a motor to which the present invention is applied.

An embodiment of a motor to which the present invention is applied will be described with reference to the accompanying drawings. In the following descriptions, in a direction where a rotation center axial line "L" of a rotation shaft 50 of a motor 10 is extended, a side where the rotation shaft 50 is protruded from a stator 4 is an output side "L1" and an opposite side to the side where the rotation shaft 50 is protruded from the stator 4 is an opposite-to-output side "L2". Further, in order to explain a terminal part 25 and a terminal cover 7, a direction where the terminal part 25 and the terminal cover 7 are overlapped with each other is referred to as a first direction "X" and, in the following descriptions, one side in the first direction "X" (side where the terminal cover 7 is located) is indicated with "X1" and the other side in the first direction "X" (side where the terminal part 25 is located) is indicated with "X2". Further, in the terminal part 25 and the terminal cover 7, a direction along a circumferential direction of the motor 10 is referred to as a second direction "Y" and, in the following descriptions, one side in the second direction "Y" is indicated with "Y1" and the other side is indicated with "Y2". Further, a direction intersecting the first direction "X" and the second direction "Y" is referred to as a third direction "Z" and, in the following descriptions, one side in the third direction "Z" is indicated with "Z1" and the other side is indicated with "Z2". In the following descriptions, the third direction "Z" is a direction where the rotation center axial line "L" is extended, and one side "Z1" in the third direction "Z" corresponds to an opposite-to-output side "L2" and the other side "Z2" in the third direction "Z" corresponds to an output side "L1".

(Structure of Motor 10)

Figure 1B:
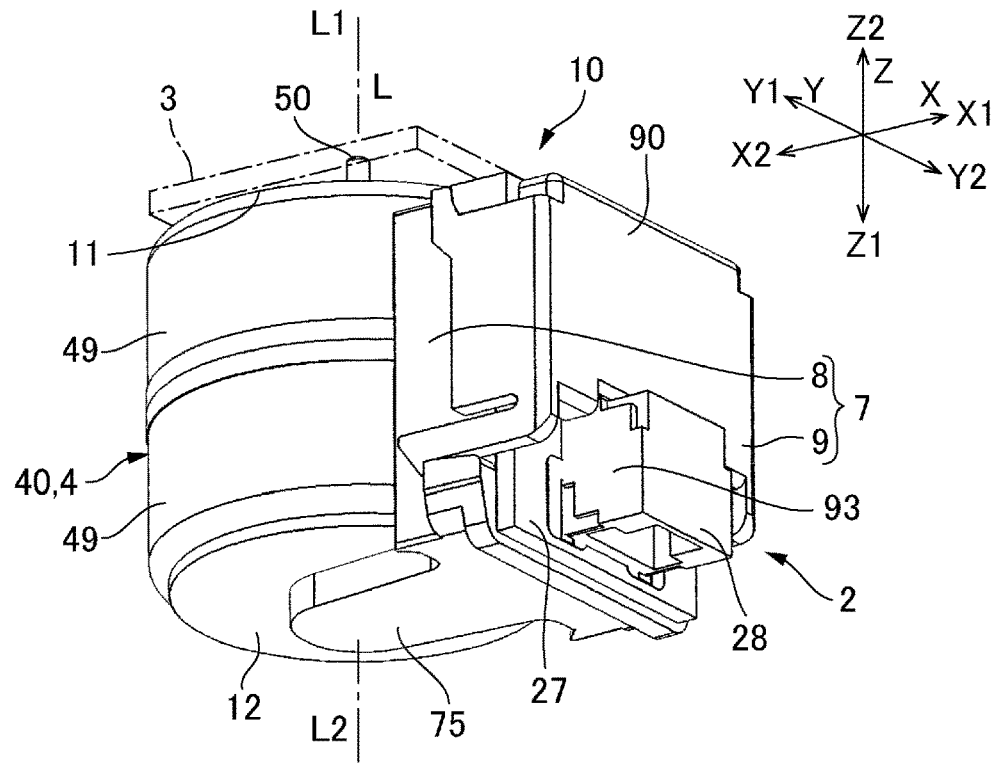
Figure 2:
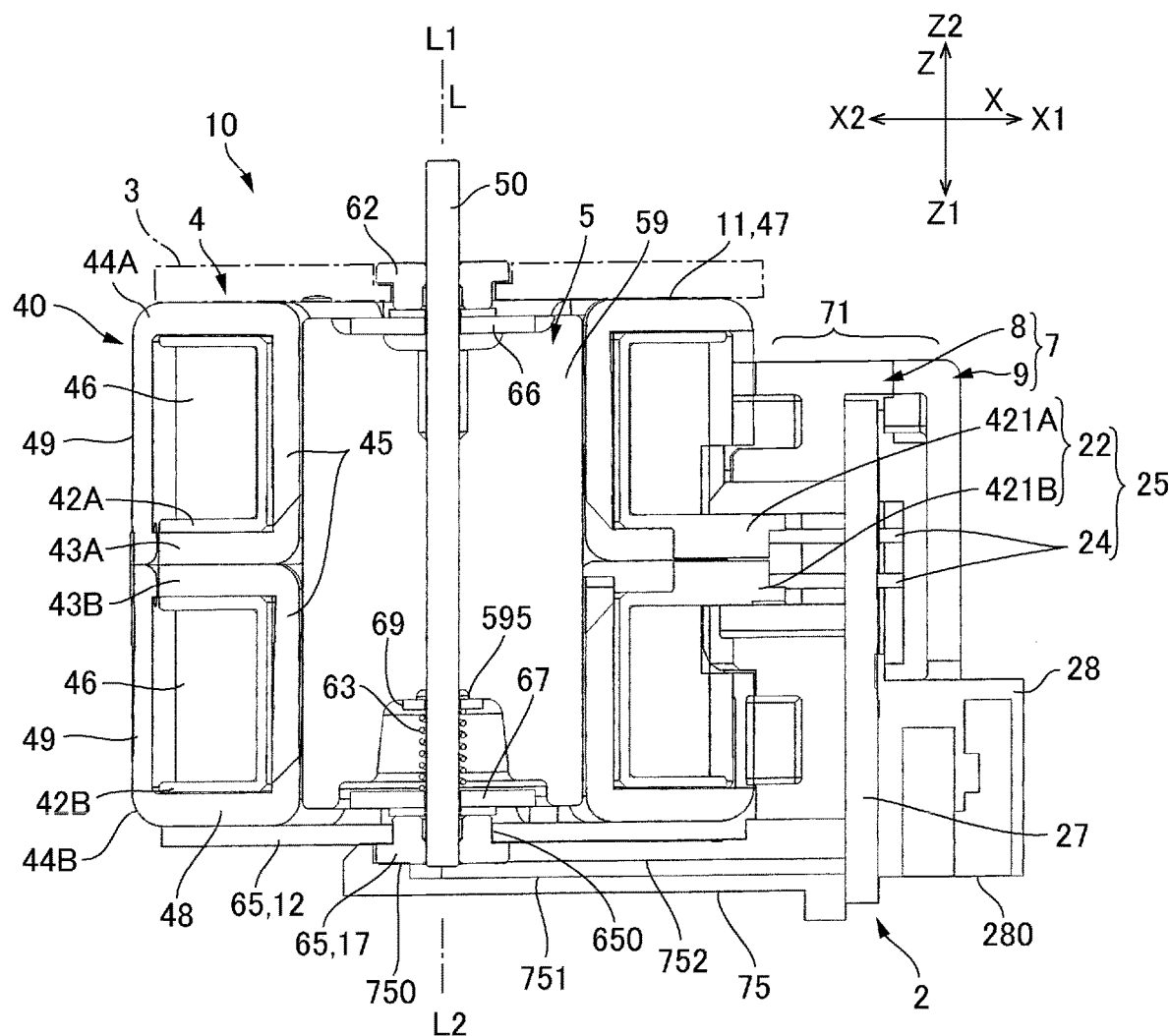
FIG. 2 is the "XZ" cross-sectional view showing the motor to which the present invention is applied.

FIGS. 1(a) and 1(b) are explanatory views showing the motor 10 to which the present invention is applied. FIG. 1(a) is a perspective view showing the motor 10 which is viewed from the output side "L1" and FIG. 1(b) is a perspective view showing the motor 10 which is viewed from the opposite-to-output side "L2". FIG. 2 is the "XZ" cross-sectional view showing the motor 10 to which the present invention is applied. In FIGS. 1(a) and 1(b), an end plate 3 on the output side "L1" is indicated by the alternate long and short dash line so that a structure on the output side "L1" of a motor main body 40 is easily understood. Further, similarly in FIG. 2, the end plate 3 on the output side "L1" is indicated by the alternate long and short dash line.

As shown in FIGS. 1(a) and 1(b), the motor 10 includes the motor main body 40 (stator 4) and the end plate 3 which is fixed to an end face 11 on an output side "L1" of the motor main body 40 by a method such as welding. In the motor 10, a power feeding part 2 is provided on a side face of the motor main body 40 (stator 4) on one side "X1" in the first direction "X". In the power feeding part 2, as described below, a wiring board 27 on which a connector 28 is mounted is held by a terminal cover 7 fixed to the side face of the stator 4.

As shown in FIG. 2, the motor 10 is a stepping motor which includes the stator 4 in a cylindrical tube shape. The stator 4 is structured so that an "A"-phase stator and a "B"-phase stator are disposed so as to be superposed on each other in the rotation center axial line "L" direction. Therefore, in the stator 4, two coil bobbins (first coil bobbin 42A and second coil bobbin 42B) around which a coil wire 46 is wound are disposed in a superposed state in the rotation center axial line "L" direction, and stator cores described below are disposed in a superposed state in each of the coil bobbins. A ring-shaped inner stator core 43A and an outer stator core 44A whose cross section is a "U"-shape are disposed on both sides of the first coil bobbin 42A in the rotation center axial line "L" direction in a superposed state, and a ring-shaped inner stator core 43B and an outer stator core 44B whose cross section is a "U"-shape are disposed on both sides of the second coil bobbin 42B in the rotation center axial line "L" direction in a superposed state. A plurality of pole teeth 45 of the inner stator cores 43A and 43B and the outer stator cores 44A and 44B are structured to be adjacently arranged on inner peripheral faces of the first coil bobbin 42A and the second coil bobbin 42B in a circumferential direction. In this way, the stator 4 in a cylindrical tube shape is structured and a rotor 5 is coaxially disposed on an inner side in a radial direction of the stator 4. In this embodiment, the outer stator cores 44A and 44B are respectively extended to an outer side in the radial direction of the first coil bobbin 42A and the second coil bobbin 42B to structure a motor case.

Therefore, a main body portion (motor main body 40) of the motor 10 in this embodiment is schematically structured of the stator 4. An end face 11 on the output side "L1" of the motor main body 40 is structured of a ring-shaped portion 47 of the outer stator core 44A. On the opposite-to-output side "L2" of the stator 4, an end plate 65 is fixed to a ring-shaped portion 48 of the outer stator core 44B, and an end face 12 on the opposite-to-output side "L2" of the motor 10 is structured of the end plate 65. Further, a side face of the motor main body 40 is structured of cylindrical tube portions 49 formed on outer sides of the outer stator cores 44A and 44B.

In the rotor 5, a rotation shaft 50 is extended along the rotation center axial line "L", and the rotation shaft 50 is protruded from the end face 11 on the output side "L1" of the motor 10. A permanent magnet 59 in a cylindrical tube shape is fixed at a position on an opposite-to-output side "L2" of the rotation shaft 50 with an adhesive or the like. An outer peripheral face of the permanent magnet 59 faces the pole teeth 45 of the stator 4 on an inner side in the radial direction of the stator 4 through a predetermined gap space.

On the output side "L1" of the motor 10, the rotation shaft 50 is supported by a bearing 62 which is held by the end plate 3 shown in FIG. 1(a). A washer 66 through which the rotation shaft 50 is penetrated is disposed between the bearing 62 and the permanent magnet 59.

On the opposite-to-output side "L2" of the motor 10, the end plate 65 is formed with a hole 650 through which an end part on the opposite-to-output side "L2" of the rotation shaft 50 is protruded to the opposite-to-output side "L2". A bearing 61 which supports the rotation shaft 50 on the opposite-to-output side "L2" is disposed in the hole 650, and a protruded part 17 in a circular plate shape which is protruded to the opposite-to-output side "L2" from the end face 12 on the opposite-to-output side "L2" is formed in the motor main body 40 by the bearing 61. The protruded part 17 is structured of the bearing 61 and thus the protruded part 17 is located on the rotation center axial line "L" of the rotation shaft 50.

A washer 67 through which the rotation shaft 50 is penetrated is disposed between the bearing 61 and the permanent magnet 59. A coiled spring 63 which urges the rotor 5 to the output side "L1" is disposed around the rotation shaft 50 between a bottom part of a recessed part 595 of the permanent magnet 59 and the washer 67. A washer 69 through which the rotation shaft 50 is penetrated is disposed between the bottom part of the recessed part 595 of the permanent magnet 59 and the coiled spring 63.

(Structure of Terminal Part 25)

Figure 3A:
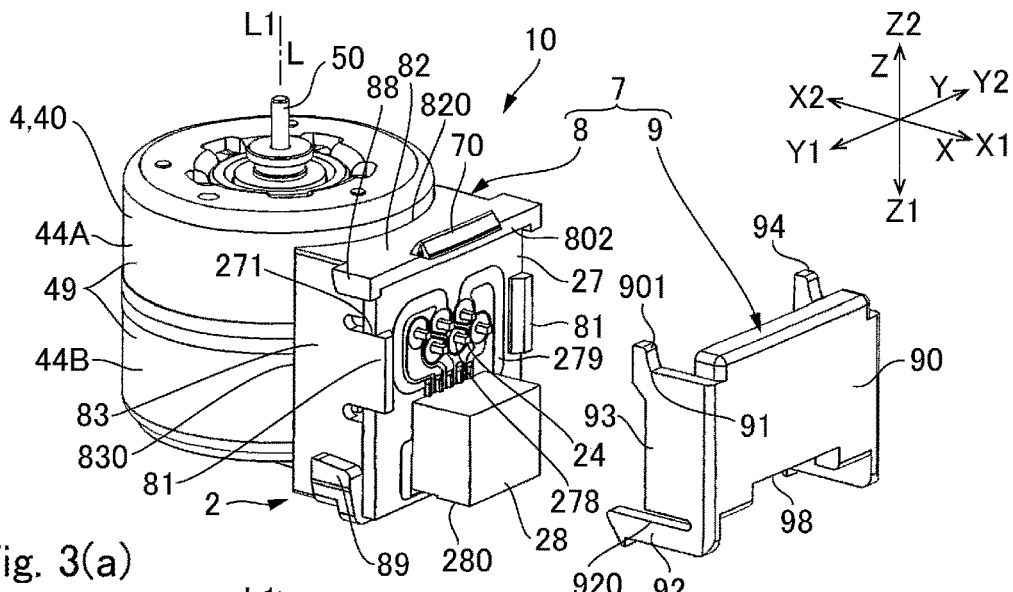
FIGS. 3(a), 3(b) and 3(c) are exploded perspective views showing a power feeding part of the motor to which the present invention is applied and which are viewed from an output side.
Figure 3B:
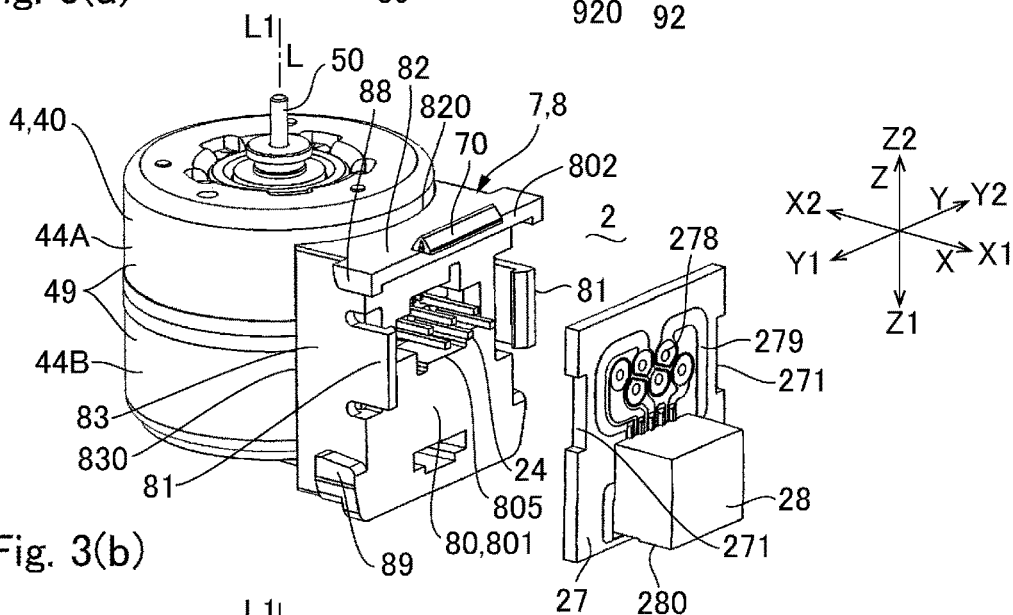
Figure 3C:
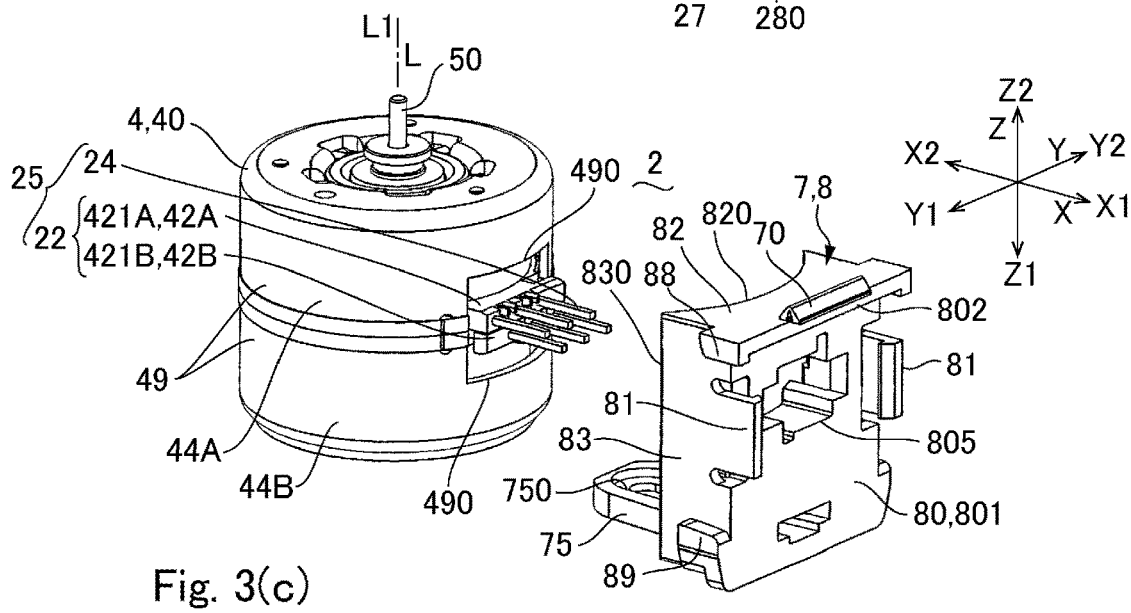
Figure 4A:
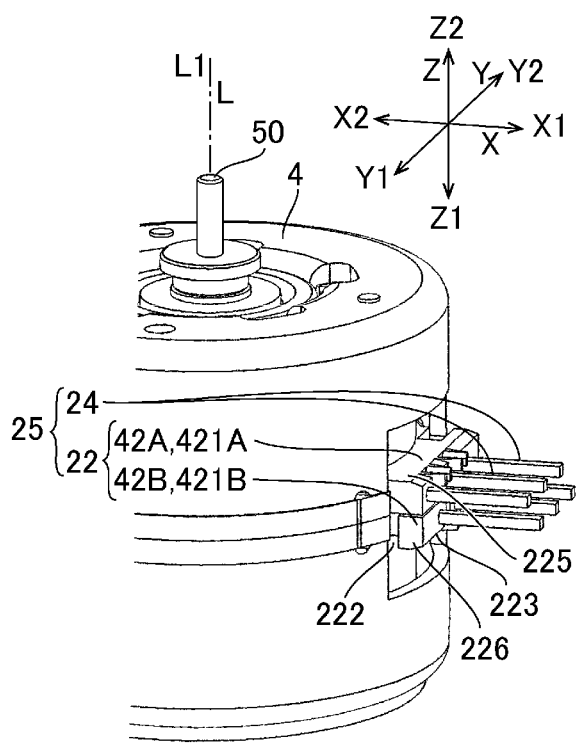
FIGS. 4(a), 4(b), 4(c) and 4(d) are enlarged perspective views showing a terminal part of the motor to which the present invention is applied.
Figure 4C:
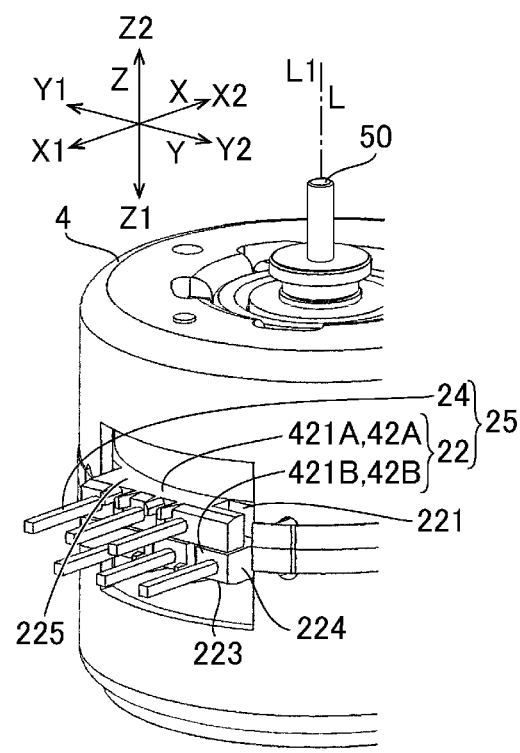
Figure 4B:
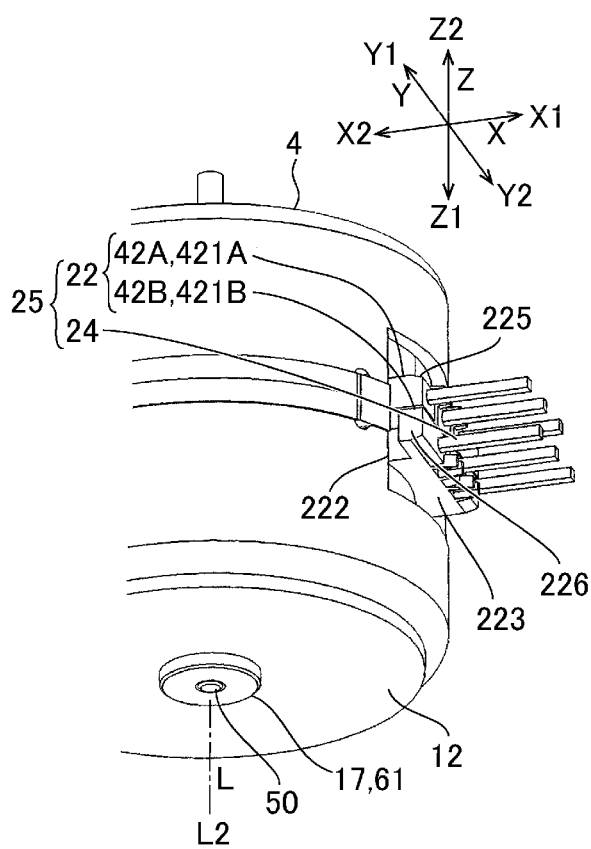
Figure 4D:
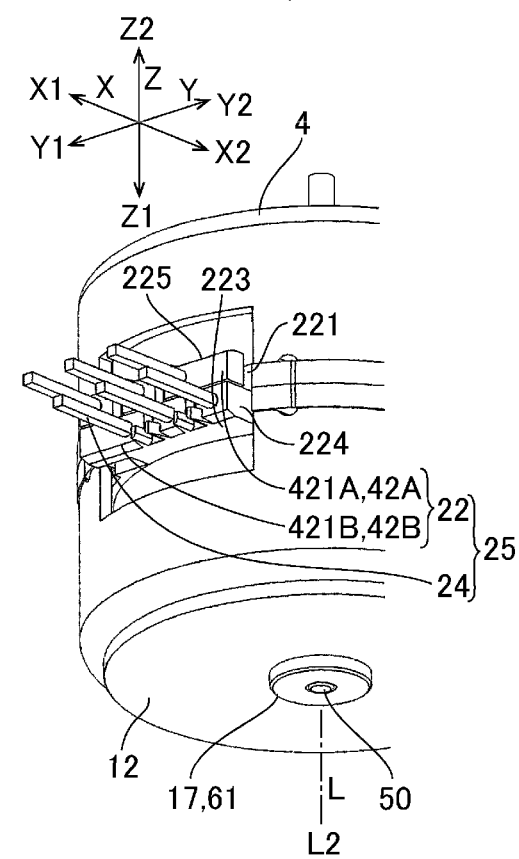
Figure 5A:
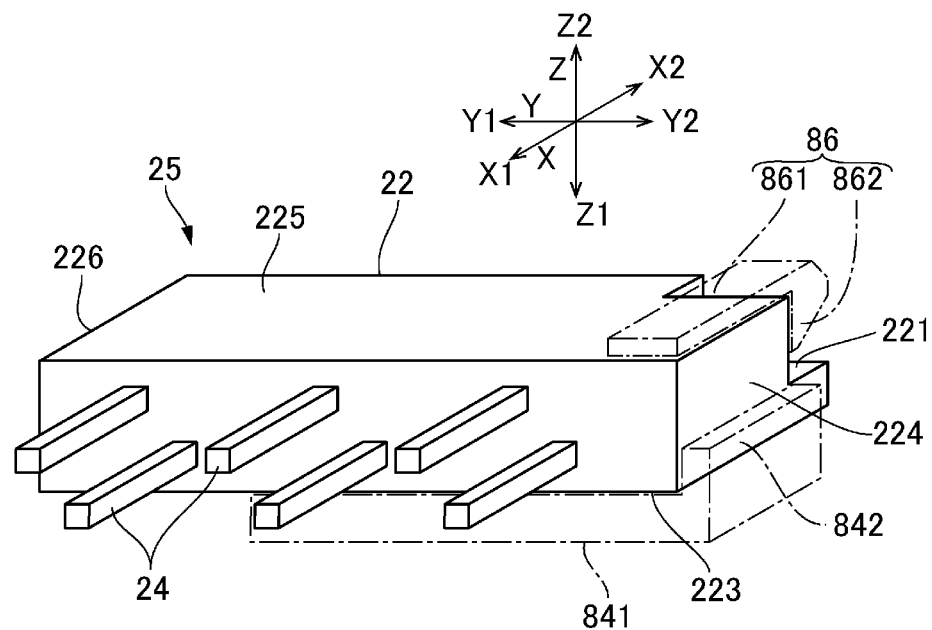
FIGS. 5(a) and 5(b) are explanatory views schematically showing an engagement structure of a motor main body with a first member of a terminal cover in the motor to which the present invention is applied.
Figure 5B:
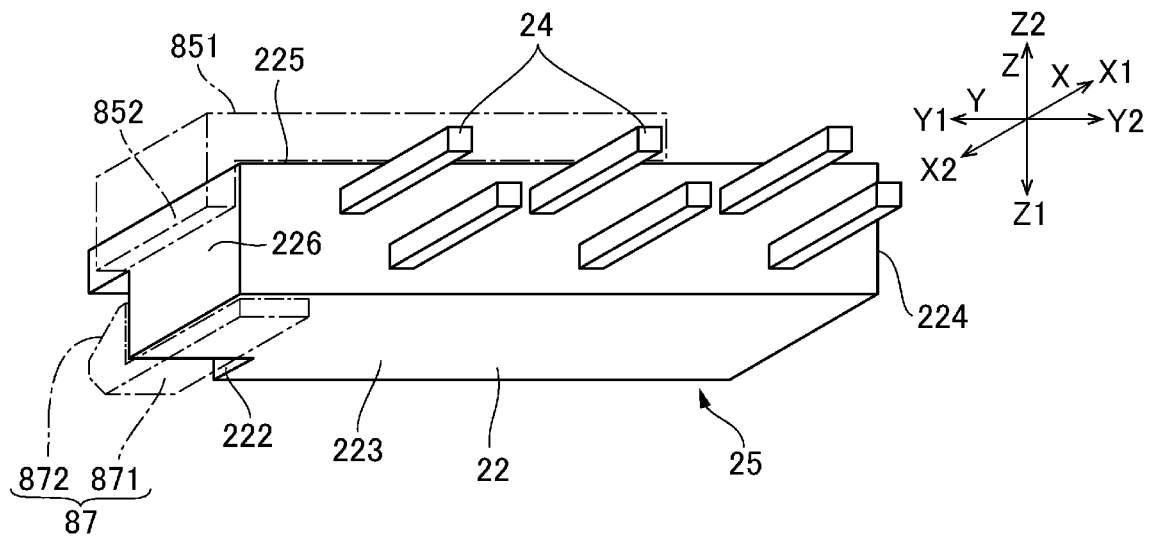

FIGS. 3(a), 3(b) and 3(c) are exploded perspective views showing the power feeding part 2 of the motor 10 to which the present invention is applied and which are viewed from the output side "L1". FIG. 3(a) is a perspective view showing a state that a second member 9 of the terminal cover 7 provided in the power feeding part 2 is detached, FIG. 3(b) is a perspective view showing a state that the wiring board 27 provided in the power feeding part 2 is further detached, and FIG. 3(c) is a perspective view showing a state that a first member 8 of the terminal cover 7 provided in the power feeding part 2 is further detached. FIGS. 4(a), 4(b), 4(c) and 4(d) are enlarged perspective views showing the terminal part 25 of the motor 10 to which the present invention is applied. FIG. 4(a) is a perspective view showing the terminal part 25 which is viewed from one side "Y1" in the second direction "Y" and the other side "Z2" in the third direction "Z", FIG. 4(b) is a perspective view showing the terminal part 25 viewed from one side "Y1" in the second direction "Y" and one side "Z1" in the third direction "Z", FIG. 4(c) is a perspective view showing the terminal part 25 viewed from the other side "Y2" in the second direction "Y" and the other side "Z2" in the third direction "Z", and FIG. 4(d) is a perspective view showing the terminal part 25 viewed from the other side "Y2" in the second direction "Y" and one side "Z1" in the third direction "Z". FIGS. 5(a) and 5(b) are explanatory views schematically showing an engagement structure of the motor main body 40 with the first member 8 of the terminal cover 7 in the motor 10 to which the present invention is applied. FIG. 5(a) is an explanatory view showing a terminal block 22 which is viewed from the other side "Y2" in the second direction "Y", and FIG. 5(b) is an explanatory view showing the terminal block 22 which is viewed from one side "Y1" in the second direction "Y". In this embodiment, the terminal cover 7 is actually one product structured of the first member 8 and the second member 9 which are connected with each other through a hinge part 70. However, in FIGS. 3(a), 3(b) and 3(c), the first member 8 and the second member 9 are shown in a divided state at the hinge part 70 in order to allow easy understanding of the shapes of the respective portions.

As shown in FIGS. 3(a), 3(b) and 3(c), the power feeding part 2 includes the terminal part 25 of the motor main body 40 and the terminal cover 7 which covers the terminal part 25. The wiring board 27 which holds a connector 28 is held by the terminal cover 7. In this embodiment, the terminal cover 7 includes the first member 8 which is fixed to the stator 4 on one side "X1" in the first direction "X" and the second member 9 which covers the first member 8 from one side "X1" in the first direction "X".

The terminal part 25 includes the terminal block 22 protruded to one side "X1" in the first direction "X" from cut-out parts 490 formed in the cylindrical tube portions 49 of the outer stator cores 44A and 44B, and a plurality of terminals 24 in a pin shape which are protruded to one side "X1" in the first direction "X" from the terminal block 22. The terminal block 22 is structured so that a thick portion 421A of the first coil bobbin 42A provided on one side "X1" in the first direction "X" and a thick portion 421B of the second coil bobbin 42B provided on one side "X1" in the first direction "X" are superposed on each other in the third direction "Z" (rotation center axial line "L" direction). The terminals 24 are protruded toward one side "X1" in the first direction "X" from each of the thick portions 421A and 421B.

The terminal block 22 is provided on an inner side in the radial direction with a recessed part which is opened toward one side in the rotation center axial line "L" direction in a part in the circumferential direction of the motor main body 40. More specifically, the terminal block 22 is, as shown in FIGS. 4(a) and 4(b) and FIG. 5(b), provided on an inner side in the radial direction with a recessed part 222 which is opened toward the opposite-to-output side "L2" in the rotation center axial line "L" direction in a part in the circumferential direction of the motor main body 40 (end part on one side "Y1" in the second direction "Y"). Further, the terminal block 22 is, as shown in FIGS. 4(c) and 4(d) and FIG. 5(a), provided on an inner side in the radial direction with a recessed part 221 which is opened toward the output side "L1" in the rotation center axial line "L" direction in a part in the circumferential direction of the motor main body 40 (end part on the other side "Y2" in the second direction "Y"). The recessed parts 221 and 222 are engaged with pawl parts 862 and 872 of the first member 8 which are described below with reference to FIGS. 6(a) and 6(b).

Further, the terminal block 22 is, as shown in FIGS. 4(a), 4(b), 4(c) and 4(d), and FIGS. 5(a) and 5(b), provided with end parts 223 and 225 facing the other side in the rotation center axial line "L" direction, and end parts 224 and 226 facing one side in the circumferential direction. The end parts 223, 225, 224 and 226 are abutted with the first engaging protruded parts 841 and 851 of the first member 8 and the second engaging protruded parts 842 and 852 of the first member 8 which are described below with reference to FIGS. 6(a) and 6(b). More specifically, the terminal block 22 is provided with the end part 223 which faces the opposite-to-output side "L2" in the rotation center axial line "L" direction (one side "Z1" in the third direction "Z") and the end part 224 which faces the other side "Y2" in the second direction "Y". The end parts 223 and 224 are respectively abutted with the first engaging protruded part 841 and the second engaging protruded part 842 of the first member 8 which are described below with reference to FIGS. 6(a) and 6(b). Further, the terminal block 22 is provided with the end part 225 on the output side "L1" in the rotation center axial line "L" direction and the end part 226 which faces one side "Y1" in the second direction "Y". The end parts 225 and 226 are respectively abutted with the first engaging protruded part 851 and the second engaging protruded part 852 of the first member 8 which are described below with reference to FIGS. 6(*a*) and 6(*b*).

(Structure of Terminal Cover 7)

FIGS. 6(*a*) and 6(*b*) are perspective views showing the terminal cover 7 of the motor 10 to which the present invention is applied and which are viewed from the other side "X2" in the first direction. FIG. 6(*a*) is a perspective view showing a state that the terminal cover 7 is developed and FIG. 6(*b*) is a perspective view showing a state that the second member 9 is overlapped with the first member 8 of the terminal cover 7. FIGS. 7(*a*) and 7(*b*) are perspective views showing the terminal cover 7 of the motor 10 to which the present invention is applied and which are viewed from one side "X1" in the first direction "X". FIG. 7(*a*) is a perspective view showing a state that the terminal cover 7 is developed and FIG. 7(*b*) is a perspective view showing a state that the second member 9 is overlapped with the first member 8 of the terminal cover 7.

As shown in FIGS. 3(*a*), 3(*b*) and 3(*c*), FIGS. 6(*a*) and 6(*b*), and FIGS. 7(*a*) and 7(*b*), the terminal cover 7 is provided with the first member 8 which is fixed to the motor main body 40 on one side "X1" in the first direction "X" and the second member 9 which covers the first member 8 from one side "X1" in the first direction "X". The first member 8 and the second member 9 are connected with each other through the hinge part 70. The hinge part 70 connects the second member 9 with the first member 8 so that the second member 9 is capable of turning around an axial line "Y0" extended in the second direction "Y". Therefore, when the second member 9 is turned to one side "R1" around the axial line "Y0" at the hinge part 70 with respect to the first member 8, the second member 9 covers the first member 8 from one side "X1" in the first direction "X". In this embodiment, the terminal cover 7 is a resin molded product, and the first member 8, the second member 9 and the hinge part 70 are integrally molded each other.

(Structure of First Member 8)

The first member 8 is provided with a plate part 80, which faces the terminal block 22 on one side "X1" in the first direction "X", a first side plate part 82 which is protruded from an end part on the other side "Z2" in the third direction "Z" of the plate part 80 toward the other side "X2" in the first direction "X", and a pair of second side plate parts 83 which are protruded from both end parts in the second direction "Y" of the plate part 80 toward the other side "X2" in the first direction "X". The plate part 80 is formed with a through hole 805 in a substantially rectangular shape structured to pass the terminals 24 from the other side "X2" in the first direction "X" to one side "X1".

Each of outer faces of a pair of the second side plate parts 83 is formed with a first engaging protruded part 88 protruded toward an outer side in the "Y" direction at an end part on the other side "Z2" in the third direction "Z". Further, each of the outer faces of the pair of the second side plate parts 83 is formed with a second engaging protruded part 89 protruded toward an outer side in the "Y" direction at an end part on one side "Z1" in the third direction "Z". The first engaging protruded part 88 and the second engaging protruded part 89 are engaged with a first engaging part 91 and a second engaging part 92 of the second member 9 described below to maintain an overlapped state of the second member 9 with the first member 8 at a predetermined position. The first engaging protruded part 88 and the second engaging protruded part 89 are separated from each other in the third direction "Z", and the first engaging protruded part 88 is located at a position closer to the hinge part 70 than the second engaging protruded part 89.

(Structure of Abutting Part of First Member 8)

In order to fix the first member 8 to a side face of the motor main body 40, a tip end face of the first side plate part 82 is formed to be an abutting part 820 which is curved so as to follow a side face shape of the motor main body 40 and, when the first member 8 is attached to the side face of the motor main body 40, the abutting part 820 is abutted with the side face of the motor main body 40 over a predetermined angular range in the circumferential direction. Further, a tip end face of the second side plate part 83 is formed to be an abutting part 830 which is flat so as to follow the side face shape of the motor main body 40. The abutting part 830 is abutted with the side face of the motor main body 40 over a predetermined range in the rotation center axial line "L" direction (third direction "Z"). Further, a frame-shaped protruded part 835 which is protruded to the other side "X2" in the first direction "X" from the plate part 80 is formed on one side "Z1" in the third direction "Z" with respect to the through hole 805. Two side portions of the protruded part 835 which are extended in the second direction "Y" are formed to be an abutting part 836 which is curved so as to follow the side face shape of the motor main body 40 and, when the first member 8 is overlapped with the side face of the motor main body 40, the abutting part 836 is abutted with the side face of the motor main body 40 over a predetermined angular range in the circumferential direction. Further, two side portions of the protruded part 835 which are extended in the third direction "Z" are formed to be an abutting part 837 which is flat so as to follow the side face shape of the motor main body 40 and, when the first member 8 is overlapped with the side face of the motor main body 40, the abutting part 837 is abutted with the side face of the motor main body 40 over a predetermined range in the rotation center axial line "L" direction (third direction "Z"). As a result, the first member 8 is positioned in the first direction "X" by the side face of the motor main body 40.

(Structure of Engaging Part of First Member 8)

The first member 8 is formed with an engaging part which is engaged with the motor main body 40 to fix the first member 8 to the motor main body 40. An engaging part 86 which is protruded from the plate part 80 toward the other side "X2" in the first direction "X" is formed in the plate part 80 at a position adjacent to the through hole 805 on the other side "Y2" in the second direction "Y". The engaging part 86 is provided with an arm part 861 protruded toward the other side "X2" in the first direction "X" and a pawl part 862 which is bent from a tip end part of the arm part 861 to one side "Z1" in the third direction "Z". Further, an engaging part 87 which is protruded from the plate part 80 toward the other side "X2" in the first direction "X" is formed in the plate part 80 at a position adjacent to the through hole 805 on one side "Y1" in the second direction "Y". The engaging part 87 is provided with an arm part 871 protruded toward the other side "X2" in the first direction "X" and a pawl part 872 which is bent from a tip end part of the arm part 871 to the other side "Z2" in the third direction "Z".

Therefore, when the first member 8 is overlapped and fitted to the side face of the motor main body 40, as schematically shown in FIG. 5(*a*), the arm part 861 of the engaging part 86 is contacted with the end part 225 of the terminal block 22 on one side in the rotation center axial line "L" direction (other side "Z2" in the third direction "Z") and the pawl part 862 of the tip end part of the arm part 861 is engaged with the recessed part 221 of the terminal block 22 from one side in the rotation center axial line "L" direction (other side "Z2" in the third direction "Z"). Further, when the first member 8 is overlapped and fitted to the side face of the motor main body 40, as schematically shown in FIG. 5(b), the arm part 871 of the engaging part 87 is contacted with the end part 223 of the terminal block 22 on one side in the rotation center axial line "L" direction (one side "Z1" in the third direction "Z") and the pawl part 872 of the tip end part of the arm part 871 is engaged with the recessed part 222 of the terminal block 22 from one side in the rotation center axial line "L" direction (one side "Z1" in the third direction "Z"). Therefore, the first member 8 is fixed to the motor main body 40 from both sides in the first direction "X" and from both sides in the third direction "Z".

Figure 6A:
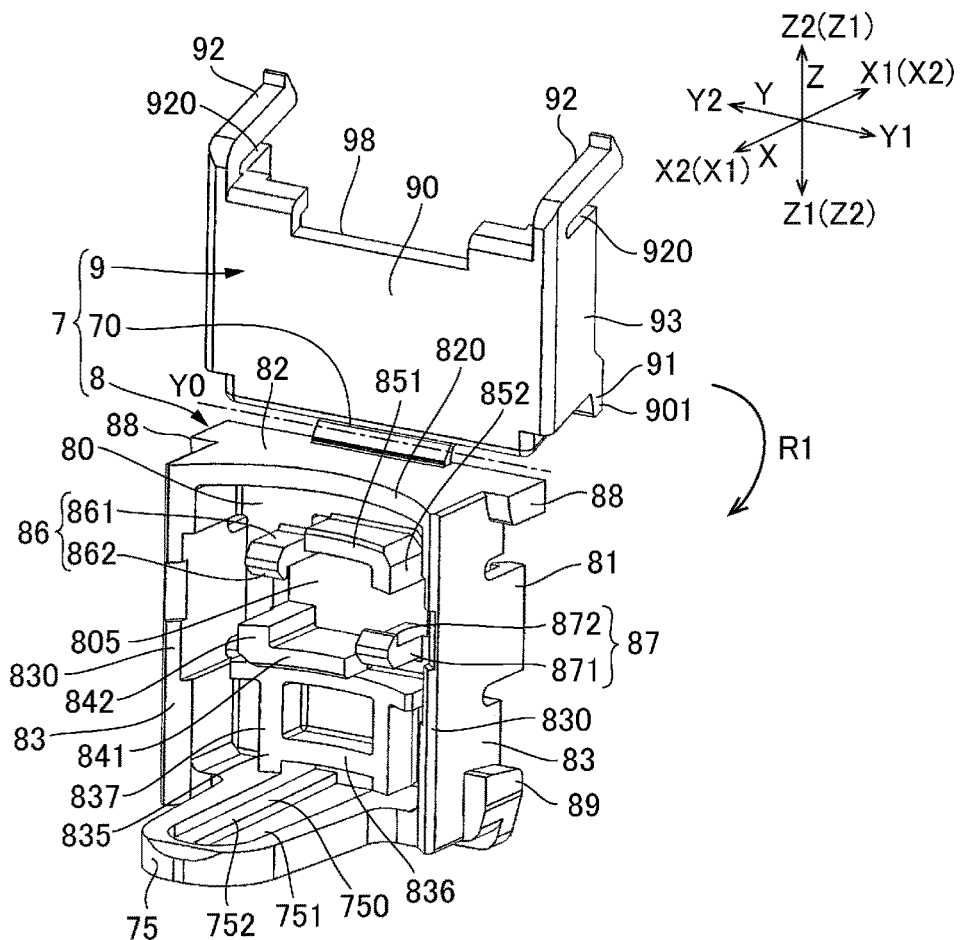
FIGS. 6(a) and 6(b) are perspective views showing the terminal cover of the motor to which the present invention is applied and which are viewed from the other side in a first direction.
Figure 6B:
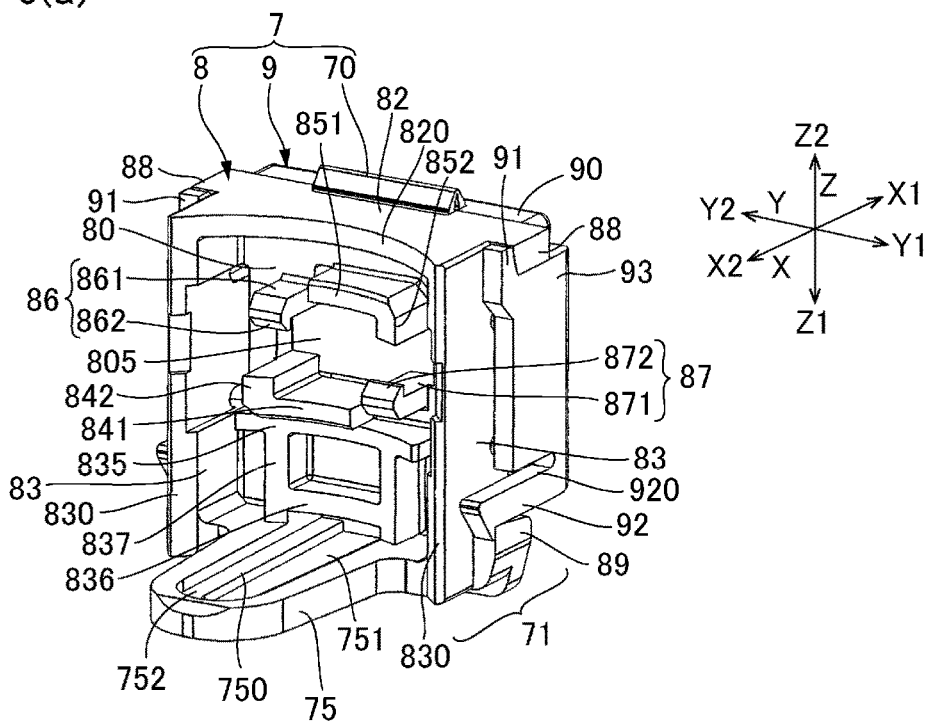
Figure 7A:
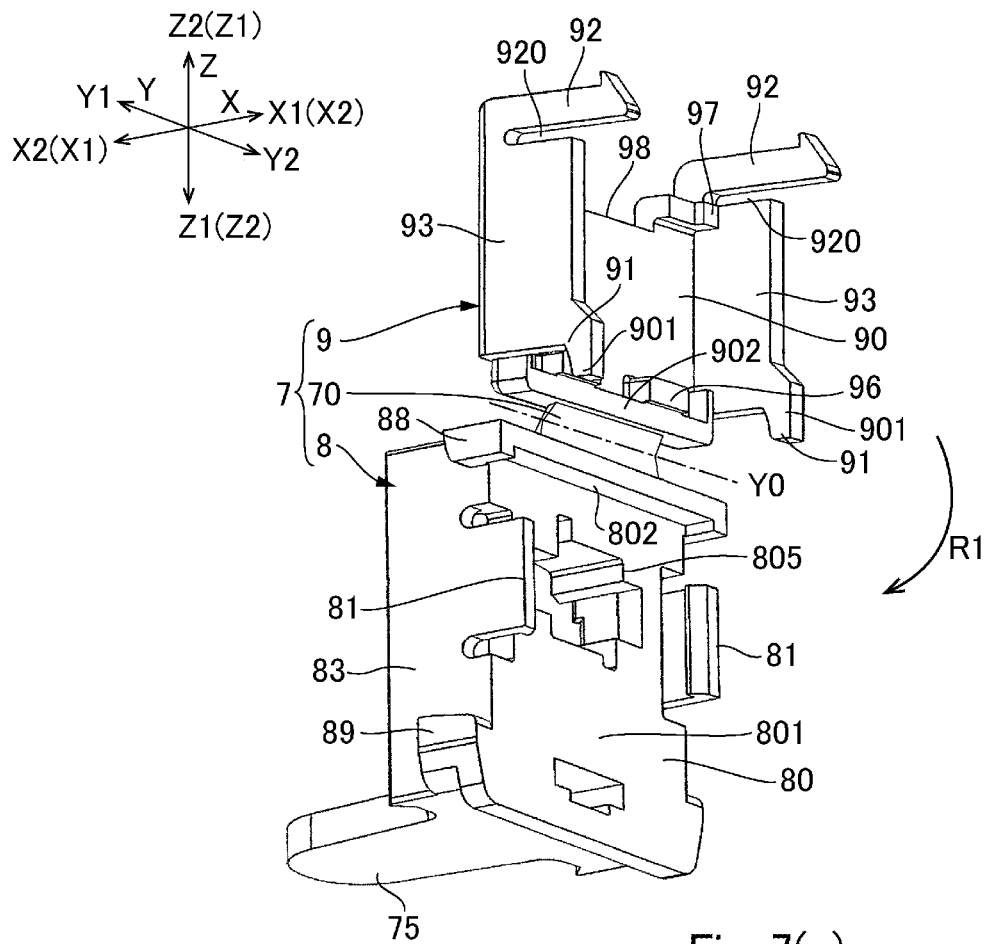
FIGS. 7(a) and 7(b) are perspective views showing the terminal cover of the motor to which the present invention is applied and which are viewed from one side in the first direction.
Figure 7B:
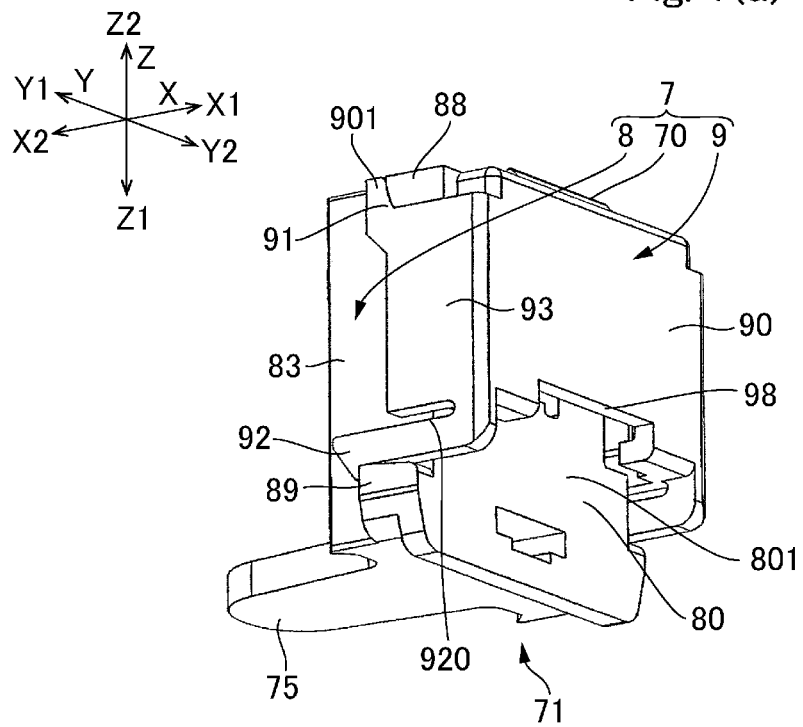

In FIGS. 6(a) and 6(b), the first engaging protruded part 841 protruded from the plate part 80 toward the other side "X2" in the first direction "X" is extended in the second direction "Y" in the plate part 80 along the through hole 805 at a position adjacent to the through hole 805 on the other side "Y2" in the second direction "Y" and one side "Z1" in the third direction "Z". Further, the second engaging protruded part 842 protruded from the plate part 80 toward the other side "X2" in the first direction "X" is extended in the third direction "Z" in the plate part 80 along the through hole 805 at a position adjacent to the through hole 805 on one side "Z1" in the third direction "Z" and the other side "Y2" in the second direction "Y".

Similarly, the first engaging protruded part 851 protruded from the plate part 80 toward the other side "X2" in the first direction "X" is extended in the second direction "Y" in the plate part 80 along the through hole 805 at a position adjacent to the through hole 805 on one side "Y1" in the second direction "Y" and on the other side "Z2" in the third direction "Z". Further, the second engaging protruded part 852 protruded from the plate part 80 toward the other side "X2" in the first direction "X" is extended in the third direction "Z" in the plate part 80 along the through hole 805 at a position adjacent to the through hole 805 on the other side "Z2" in the third direction "Z" and on one side "Y1" in the second direction "Y".

Therefore, when the first member 8 is overlapped and fitted to the side face of the motor main body 40, as schematically shown in FIG. 5(a), the first engaging protruded part 841 is abutted with the end part 223 of the terminal block 22 from one side "Z1" in the third direction "Z", and the second engaging protruded part 842 is abutted with the end part 224 of the terminal block 22 from the other side "Y2" in the second direction "Y". Further, when the first member 8 is overlapped and fitted to the side face of the motor main body 40, as schematically shown in FIG. 5(b), the first engaging protruded part 851 is abutted with the end part 225 of the terminal block 22 from the other side "Z2" in the third direction "Z", and the second engaging protruded part 852 is abutted with the end part 226 of the terminal block 22 from one side "Y1" in the second direction "Y". Therefore, the first member 8 is fixed to the motor main body 40 from both sides in the second direction "Y" and from both sides in the third direction "Z".

(Structure of Engaging Plate Part 75)

A portion of the terminal cover 7 in this embodiment which is overlapped with the side face of the motor main body 40 is formed to be a cover part 71 which covers the terminal part 25 and, in addition, the first member 8 of the terminal cover 7 is provided with an engaging plate part 75 which is extended from the cover part 71 and is overlapped with the end face 12 on the opposite-to-output side "L2" of the motor main body 40. The engaging plate part 75 is formed with an engaging recessed part 750 which is opened toward the output side "L1", and the engaging recessed part 750 is fitted with the protruded part 17 which is protruded from the end face 12 on the opposite-to-output side "L2" of the motor main body 40.

In this embodiment, the engaging recessed part 750 is formed in a groove shape which is extended along the engaging plate part 75 and a width of the engaging recessed part 750 is narrowed toward a tip end side from a side (root side) of the cover part 71. A width on the tip end side of the engaging recessed part 750 is equal to an outer diameter of the protruded part 17, and the protruded part 17 is fitted and engaged with the tip end part of the engaging recessed part 750.

A center portion 751 in a width direction of the engaging recessed part 750 is formed to be deeper than an adjacent portion 752 which is adjacent on both sides of the center portion 751. Therefore, the protruded part 17 is abutted with the adjacent portion 752 and is not contacted with the center portion 751. Therefore, even when an end part on the opposite-to-output side "L2" of the rotation shaft 50 is exposed from the bearing 61 structuring the protruded part 17, the rotation shaft 50 does not contact with the engaging recessed part 750. Accordingly, rotation of the rotation shaft 50 is not disturbed.

(Structure of Circuit Board Support Face 801 Side of First Member 8)

A face on one side "X1" in the first direction "X" of the plate part 80 of the first member 8 is formed to be a circuit board support face 801 which supports the wiring board 27 from the other side "X2" in the first direction. The wiring board 27 is formed with holes 278 through which the terminals 24 passing through the through hole 805 are penetrated, and a face of the wiring board 27 on one side "X1" in the first direction "X" is formed with wiring patterns 279 around the holes 278 and the like. The face of the wiring board 27 on one side "X1" in the first direction "X" is mounted with a connector 28 at a position separated on one side "Z1" in the third direction "Z" with respect to the holes 278 and the like. The connector 28 is arranged so that a connecting part 280 where connector terminals (not shown) are disposed are directed to one side "Z1" in the third direction "Z".

The first member 8 is provided with circuit board holding pawls 81 at end parts on both sides in the second direction "Y" of the circuit board support face 801 so as to be protruded to one side "X1" in the first direction "X" and abutted with a face of the wiring board 27 on one side "X1" in the first direction "X". Therefore, the wiring board 27 can be held by the circuit board support face 801 and the circuit board holding pawls 81 in a thickness direction of the wiring board 27 ("X" direction). In this embodiment, a recessed part 271 is formed in portions overlapping with the circuit board holding pawls 81 at end parts of the wiring board 27 on both sides in the second direction "Y", and the circuit board holding pawls 81 are fitted to the recessed parts 271. Therefore, end parts of the wiring board 27 are held by the circuit board holding pawls 81 in an extending direction ("Z" direction) of the end parts where the recessed parts 271 are formed. Further, the circuit board holding pawls 81 are formed on both of one side "Y1" and the other side "Y2" in the "Y" direction. Therefore, the wiring board 27 is held by the two circuit board holding pawls 81 from both sides in the first direction "X", from both sides in the second direction "Y", and from both sides in the third direction "Z" in an overlapped state with the circuit board support face 801. Further, the first member 8 is provided with a positioning protruded part 802 which is protruded to one side "X1" in the first direction "X" from an end part on the other side "Z2" in the third direction "Z" of the circuit board support face 801 so as to extend in the second direction "Y". The positioning protruded part 802 is abutted with an end part on one side "X1" in the first direction "X" of the wiring board 27 to position the wiring board 27. Therefore, the first member 8 is capable of holding the wiring board 27 which is overlapped and disposed on the circuit board support face 801 at a predetermined position. Further, when connecting in the connector 28 is to be performed, a force applied to the wiring board 27 to the other side "Z2" in the third direction "Z" can be received by the positioning protruded part 802 and thus positional displacement and the like of the wiring board 27 can be suppressed.

(Structure of Second Member 9)

Next, a structure of the second member 9 will be described below. In the following descriptions, a state is described that the second member 9 is turned to one side "R1" around the axial line "Y0" through the hinge part 70 to cover the first member 8 from one side "X1" in the first direction "X". Therefore, regarding the first direction "X" and the third direction "Z", the directions of one side and the other side shown in FIG. 6(*a*) and FIG. 7(*b*) are reversed. Accordingly, when a structure of the second member 9 is to be described, the one sides "X1" and "Z1" and the other sides "X2" and "Z2" are described in directions shown by a parenthesis in FIG. 6(*a*) and FIG. 7(*a*).

As shown in FIGS. 6(*a*) and 6(*b*) and FIGS. 7(*a*) and 7(*b*), the second member 9 is provided with a plate part 90 which covers the wiring board 27 when the second member 9 is overlapped and fitted to the first member 8. The plate part 90 is formed with a cut-out part 98 for exposing the connector 28.

An end part on the other side "Z2" in the third direction "Z" of the plate part 90 is provided with a protruded part 902 which is protruded toward the other side "X2" in the first direction "X" so as to extend in the second direction. The end part where the protruded part 902 is formed and an end part on the other side "Z2" in the third direction "Z" of the first member 8 are connected with each other through the hinge part 70.

The second member 9 is formed with side plate parts 93 protruded toward the other side "X2" in the first direction "X" on both sides in the "Y" direction of the plate part 90. The side plate parts 93 are overlapped with the second side plate parts 83 of the first member 8 from outer sides.

The plate part 90 is formed with first circuit board holding parts 96 protruded to the other side "X2" in the first direction "X" at two positions in the second direction "Y" in an end part on the other side "Z2" in the third direction "Z". Further, the plate part 90 is formed with a second circuit board holding part 97 protruded to the other side "X2" in the first direction "X" in an end part on one side "Z1" in the third direction "Z". Therefore, when the second member 9 is overlapped and fitted to the first member 8, the first circuit board holding parts 96 and the second circuit board holding part 97 press the wiring board 27 on the circuit board support face 801 of the first member 8. Therefore, floating of the wiring board 27 from the circuit board support face 801 can be suppressed.

(Structure of Engaging Part of Second Member 9)

End parts on the other side "Z2" in the third direction "Z" of a pair of the side plate parts 93 of the second member 9 are formed with engaging pawls 901 protruded to the other side "Z2" in the third direction "Z". The engaging pawl 901 structures a first engaging part 91 together with an end part on other side "Z2" in the third direction "Z" of the side plate part 93.

Further, end parts on one side "Z1" in the third direction "Z" of a pair of the side plate parts 93 are formed with second engaging parts 92 in a pawl shape which are protruded to the other side "X2" in the first direction "X". A tip end part of the second engaging part 92 is bent to one side "Z1" in the third direction "Z". In this embodiment, the side plate part 93 is formed with a slit 920 along an edge of the second engaging part 92. Therefore, the second engaging part 92 is capable of being elastically deformed in the third direction "Z".

The first engaging part 91 and the second engaging part 92 are separated from each other in the third direction "Z", and the first engaging part 91 is located at a position closer to the hinge part 70 than the second engaging part 92. Therefore, when the second member 9 is turned to one side "R1" around the axial line "Y0" to overlap on the first member 8, the first engaging part 91 is abutted with the first engaging protruded part 88 of the first member 8 from the other side "X2" in the first direction "X" and from one side "Z1" in the third direction "Z". Further, the second engaging part 92 is abutted with the second engaging protruded part 89 of the first member 8 from the other side "X2" in the first direction "X" and from the other side "Z2" in the third direction "Z" at a position separated from the first engaging part 91 on one side "Z1" in the third direction "Z". In this case, the second engaging part 92 is elastically deformed to the other side "Z2" in the third direction "Z" so as to narrow the slit 920 and then the second engaging part 92 is engaged with the second engaging protruded part 89. Therefore, the second engaging part 92 is elastically abutted with the second engaging protruded part 89 of the first member 8 from the other side "Z2" in the third direction "Z".

According to this engagement mechanism, the second member 9 is prevented from disengaging from the first member 8 in a direction separated from the first member 8 by the first engaging part 91 and the second engaging part 92. Further, the first engaging part 91 and the second engaging part 92 are engaged with the first member 8 in reverse directions in the third direction "Z" and thus the first engaging part 91 and the second engaging part 92 are hard to be disengaged from the first engaging protruded part 88 and the second engaging protruded part 89. Further, when the second member 9 is turned through the hinge part 70, the first engaging part 91 is engaged passing through a position separated from the hinge part 70 with respect to the first engaging protruded part 88, and the second engaging part 92 is engaged passing through a side of the hinge part 70 with respect to the second engaging protruded part 89. Therefore, the first engaging part 91 and the first engaging protruded part 88 are surely engaged with each other and the second engaging part 92 are surely engaged with the second engaging protruded part 89.

(Principal Effects in this Embodiment)

As described above, in the terminal cover 7 fixed to the motor main body 40 of the motor 10 in this embodiment, the engaging plate part 75 is extended from the cover part 71, which covers the terminal part 25 on the side face of the motor main body 40, to a position overlapped with the end face 12 on the opposite-to-output side "L2" of the motor main body 40, and the engaging plate part 75 is provided with the engaging recessed part 750 to which the protruded part 17 of the end face 12 on the opposite-to-output side "L2" of the motor main body 40 is fitted. Therefore, even when an external force is applied to the terminal cover 7, positional displacement of the terminal cover 7 is hard to be occurred. Accordingly, trouble is hard to occur in an electrical connected portion of the terminals 24 with the wiring board 27 and the like in an inside of the terminal cover 7. Further, the protruded part 17 is structured of the bearing 61 and thus a dedicated design for providing the protruded part 17 in the motor main body 40 is not required. Further, the bearing 61 serves as a reference of the motor 10 and thus its positional accuracy is high. Therefore, engagement of the engaging plate part 75 can be performed surely. Further, it is structured that the bearing 61 is covered by the engaging plate part 75 and thus the rotation shaft 50 is suppressed from being contacted with the outside. Therefore, malfunction due to an external force can be avoided. Further, dust or a foreign matter can be prevented from being entered into the bearing 61. In addition, even when oil is impregnated into the bearing 61, the oil can be suppressed from being leaked out.

Further, the engaging recessed part 750 is formed in a groove shape and thus the protruded part 17 can be easily fitted to the engaging recessed part 750. Further, the protruded part 17 is fitted to a tip end part in an extending direction of the engaging recessed part 750 which is formed in a groove shape and thus positional displacement of the terminal cover 7 in a direction separated from the motor main body 40 is suppressed by engagement of the protruded part 17 with the engaging recessed part 750.

Further, the terminal cover 7 and the motor main body 40 are fixed to each other by the engaging parts 86 and 87 and the like and thus the terminal cover 7 can be attached to the motor main body 40 and the terminal cover 7 and the motor main body 40 can be fixed surely. Therefore, even in a case that a large force is applied to the terminal cover 7 through the connector 28 when connection or separation is performed in the connector 28, positional displacement of the terminal cover 7 can be prevented. Accordingly, malfunction is hard to occur in an electrical connected portion of the terminals 24 with the wiring board 27 and the like.

Further, in this embodiment, the terminal cover 7 is a resin molded product which is integrally provided with the first member 8 which is fixed to the motor main body 40, the second member 9 which covers the first member 8, and the hinge part 70. Therefore, after the first member 8 is fixed to the motor main body 40, the second member 9 is turned through the hinge part 70 so that the first member 8 is covered with the second member 9, and that the first member 8 and the second member 9 are engaged with each other. Accordingly, in comparison with a case that the first member 8 and the second member 9 are separately structured from each other, the number of components can be reduced and work for attaching the second member 9 to the first member 8 can be performed efficiently. As a result, a structure that the terminal part 25 of the motor main body 40 is covered by the terminal cover 7 is structured at a low cost.

Other Embodiments

In the embodiment described above, the protruded part 17 is formed by using the bearing 61. However, the protruded part 17 may be formed in the end plate 65 or the like. Further, in the embodiment described above, the engaging recessed part 750 is formed in a groove shape. However, the engaging recessed part 750 may be a hole having the same shape as the protruded part 17.

INDUSTRIAL APPLICABILITY

In the present invention, the terminal cover which covers the terminal part of the motor main body is the resin molded product which is integrally formed of the first member which is fixed to the motor main body, the second member which covers the first member, and the hinge part which connects the first member with the second member. Therefore, after the first member is fixed to the motor main body, the second member is turned through the hinge part so that the first member is covered with the second member, and that the first member and the second member are engaged with each other. Accordingly, in comparison with a case that the first member and the second member are separately structured from each other, the number of components can be reduced and work for attaching the second member to the first member can be performed efficiently.

The invention claimed is:

1. A motor comprising:
a motor main body in which a rotation shaft is protruded toward an output side; and
a terminal cover which covers a terminal part provided on one side in a first direction of the motor main body from the one side in the first direction;
wherein the terminal cover is a resin molded product integrally comprising:
a first member which is fixed to the motor main body on the one side in the first direction;
a second member which covers the first member from the one side in the first direction; and
a hinge part which turnably connects the second member with the first member around an axial line extended in a second direction intersecting the first direction; and
wherein the second member comprises an engaging part structured to fix the second member to the first member, and
the engaging part comprises at each of end parts on both sides in the second direction of the second member:
a first engaging part which is provided at a position separated from the hinge part on one side in a third direction intersecting the first direction and the second direction so as to be abutted with a first engaging protruded part of the first member from another side in the first direction and from one side in the third direction; and
a second engaging part which is provided at a position separated from the first engaging part on the one side in the third direction so as to be abutted with a second engaging protruded part of the first member from the another side in the first direction and from another side in the third direction.

2. The motor according to claim 1, wherein
the first member holds a wiring board which is electrically connected with terminals of the terminal part, and
the second member covers the wiring board from the one side in the first direction.

3. The motor according to claim 2, wherein the first member comprises:
a circuit board support face which supports the wiring board from the other side in the first direction; and
a circuit board holding pawl which is protruded from the circuit board support face to the one side in the first direction to be abutted with a face on the one side in the first direction of the wiring board.

4. The motor according to claim 3, wherein an end part of the wiring board is formed with a recessed part to which the circuit board holding pawl is fitted at an overlapped position with the circuit board holding pawl.

5. The motor according to claim 4, wherein the first member comprises a positioning protruded part which is protruded from the circuit board support face to the one side in the first direction to be abutted with an end part of the wiring board.

6. The motor according to claim 5, wherein the second member comprises a circuit board holding part which is protruded to the other side in the first direction to be abutted with the wiring board from the one side in the first direction.

7. The motor according to claim 5, wherein the wiring board holds a connector.

8. The motor according to claim 4, wherein the second member comprises a circuit board holding part which is protruded to the other side in the first direction to be abutted with the wiring board from the one side in the first direction.

9. The motor according to claim 4, wherein the wiring board holds a connector.

10. The motor according to claim 3, wherein the second member comprises a circuit board holding part which is protruded to the other side in the first direction to be abutted with the wiring board from the one side in the first direction.

11. The motor according to claim 3, wherein the wiring board holds a connector.

12. The motor according to claim 2, wherein the second member comprises a circuit board holding part which is protruded to the other side in the first direction to be abutted with the wiring board from the one side in the first direction.

13. The motor according to claim 2, wherein the wiring board holds a connector.

* * * * *